United States Patent [19]

Kawamoto

[11] Patent Number: 5,274,452
[45] Date of Patent: Dec. 28, 1993

[54] HORIZONTAL SYNCHRONIZING SIGNAL SEPARATOR

[75] Inventor: Sigeharu Kawamoto, Yokohama, Japan

[73] Assignee: Matsushita Electric Industrial Co., Ltd., Osaka, Japan

[21] Appl. No.: 853,655

[22] Filed: Mar. 19, 1992

Related U.S. Application Data

[63] Continuation-in-part of Ser. No. 709,971, Jun. 4, 1991, abandoned.

[30] Foreign Application Priority Data

Jun. 21, 1990 [JP] Japan .................................. 2-163325

[51] Int. Cl.⁵ ............................................. H04N 5/08
[52] U.S. Cl. ........................... 358/153; 358/155
[58] Field of Search ................ 358/148, 153, 154, 155

[56] References Cited

U.S. PATENT DOCUMENTS 4,353,091 10/1982 Hoppe ............................ 358/153 X
4,621,288 11/1986 Yamada ............................ 358/153
5,034,815 7/1991 Shibayama ...................... 358/155 X

FOREIGN PATENT DOCUMENTS 255474 2/1990 Japan .
2086177 5/1982 United Kingdom .

*Primary Examiner*—Victor R. Kostak
*Attorney, Agent, or Firm*—Stevens, Davis, Miller & Mosher

[57] ABSTRACT

A horizontal synchronizing signal separator in accordance with the present invention comprises an activation signal generator, when subjected to a triggering operation, for generating an activation signal having a predetermined continuous ON time duration, a front edge detector for outputting either one of first and second start pulses according to states of a video synchronizing pulse signal and the activation signal, and a first timer for making timing of the activation signal substantially coincide with timing of a front edge of the video synchronizing pulse signal on the basis of a composite signal corresponding to a composition of the first and second output signals, whereby, even in the case of a missing pulse or pulses in the video synchronizing pulse signal, the missing pulses are corrected with less phase shift in horizontal synchronization. As a result, there can be solved such a problem that, when pulse missing takes place in an equalizing pulse signal of the video synchronizing pulse signal, this causes horizontal synchronization to be disturbed in one field.

6 Claims, 3 Drawing Sheets

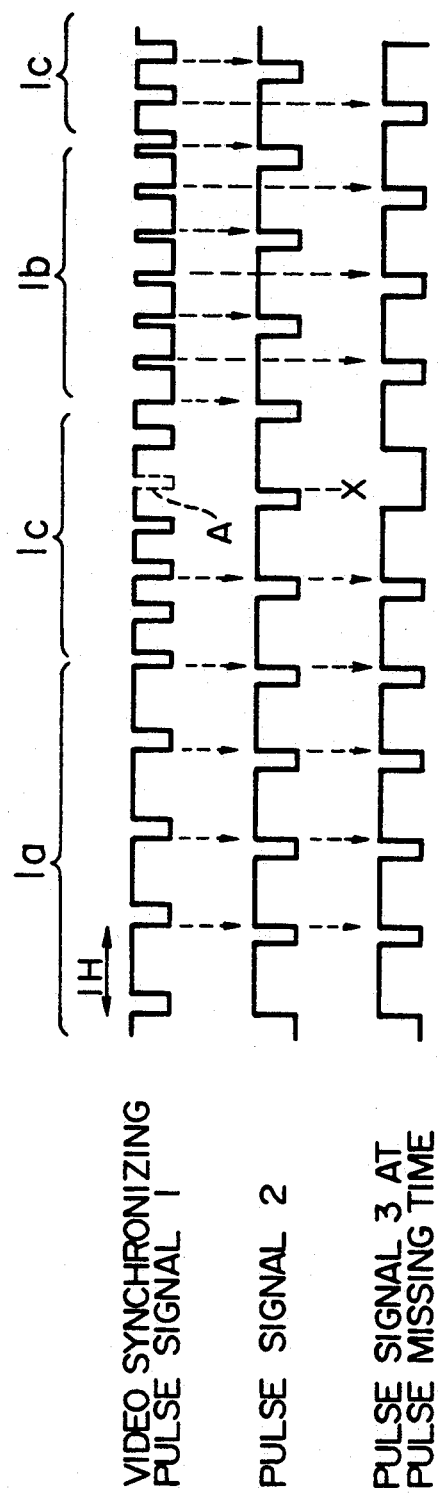

HORIZONTAL SYNCHRONIZING SIGNAL SEPARATOR

CROSS-REFERENCE

This is a Continuation-in-part application of U.S. Ser. No. 07/709,971 filed Jun. 4, 1991, abandoned.

BACKGROUND OF THE INVENTION

1. Field of the Invention

The present invention generally relates to a horizontal synchronizing signal separator which separates a horizontal synchronizing signal from a video synchronizing pulse signal for use in video signal processing.

2. Description of the Prior Art

In the transmission of a video signal based on a standard television system, a video synchronizing pulse signal comprising a horizontal synchronizing pulse signal, a vertical synchronizing signal and an equalizing pulse signal is inserted in the video signal during its flyback-line blanking time; while, on the side of video signal reception, the video synchronizing pulse signal is extracted from the received video signal and the horizontal and vertical synchronizing signals are separated from the video synchronizing pulse signal as the processing of the video signal.

Explanation will be made as to the separating operation of a horizontal synchronizing signal from a video synchronizing pulse signal in a prior art horizontal synchronizing signal separator, by referring to FIG. 3.

In FIG. 3, reference numeral 1 denotes a video synchronizing pulse signal which comprises a horizontal synchronizing pulse signal 1a, an equalizing pulse signal 1c, a vertical synchronizing pulse signal b, the equalizing pulse signal 1c, . . . , sequentially arranged from the left side in the drawing. Each of these signals 1a, 1c, 1b are assumed to have a train of 6 consecutive pulses, though partly omitted in the drawing. Reference numeral 2 denotes a pulse signal which is generated from, e.g., a monostable multivibrator for the purpose of obtaining the horizontal synchronizing signal from the video synchronizing pulse signal 1, while reference numeral 3 denotes a pulse signal which is generated from the monostable multivibrator when there is a missing pulse in the video synchronizing pulse signal 1.

In the case where such a video synchronizing pulse signal 1 based on the standard television system as shown in FIG. 3 is employed, generally speaking, if the horizontal synchronization has a period of H, then the horizontal synchronizing pulse signal 1a has a period of H and the vertical synchronizing pulse signal 1b and the equalizing pulse signal 1c have respectively a period of H/2.

Thus, when it is desired to separate a horizontal synchronizing signal from the video synchronizing pulse signal 1, such a pulse signal 2 that rises when a leading or front edge in each period H of the video synchronizing pulse signal 1 is detected and falls in a time shorter than the period H of the horizontal synchronizing signal is generated from a pulse signal generating means such as a monostable multivibrator.

And the rising edges of the pulse signal 2 are handled as the horizontal synchronizing signal obtained through separation from the video synchronizing pulse signal 1.

With the aforementioned prior art horizontal synchronizing signal separator, however, in the case where the video synchronizing pulse signal 1 is obtained from a special reproduction image signal of a video tape recorder, if such a pulse missing takes place in the equalizing pulse signal 1c as shown by an arrow A in FIG. 3, then the pulse signal obtained through detection of the front edge of the video synchronizing pulse signal 1 corresponds to the pulse signal 3 having a period shifted by a phase of H/2 in its part subsequent to the pulse missing position of the equalizing pulse signal 1c.

And the pulse signal 3 once subjected to such a phase shift cannot be returned to its original normal phase until the next front edge of the horizontal synchronizing pulse signal 1a is detected. Therefore, such a problem occurs that the horizontal synchronization remains disturbed during a time duration between the pulse missing position of the equalizing pulse signal 1c and the detection of the next front edge of the horizontal synchronizing pulse signal 1a.

SUMMARY OF THE INVENTION

It is therefore an object of the present invention to provide a horizontal synchronizing signal separator which can solve the above problem in the prior art and which can correct a pulse missing in a video synchronizing pulse signal to minimize a phase shift in horizontal synchronization, thereby realizing stable separation of a horizontal synchronizing signal.

In accordance with a first invention, the above object is attained by providing a horizontal synchronizing signal separator which comprises activation signal generating means, when subjected to a triggering operation, for generating an activation signal having a predetermined continuous ON time duration; front edge detecting means for receiving a video synchronizing pulse signal containing a horizontal synchronizing pulse signal as well as the activation signal and for outputting a first output signal when detecting a front edge of the video synchronizing pulse signal during reception period of the activation signal and for outputting a second output signal when the reception period of the activation signal is terminated without detecting any front edge of the video synchronizing pulse signal; and first timer means to be triggered when receiving either one of the first and second output signals, that is, when triggered by the first output signal, for triggering the activation signal generating means when a first time-out duration expires, while, when triggered by the second output signal, for triggering the activation signal generating means when a second time-out duration expires to cause timing of the activation signal to substantially coincide with timing of the front edge of the video synchronizing pulse signal.

With the aforementioned arrangement of the first invention, since a pulse missing in the video synchronizing pulse signal is corrected to minimize a phase shift in the horizontal synchronization, the horizontal synchronizing signal can be separated stably.

Another object of the present invention is to provide a horizontal synchronizing signal separator which can prevent such a phenomenon that, when correction is made over consecutive missing pulses in a video synchronizing pulse signal, phase shifts in horizontal synchronization are accumulated and thus it becomes impossible to detect a front edge in the normal video synchronizing pulse signal any longer.

In accordance with a second invention, the above second object is attained by providing a second timer means for receiving the first and second output signals form the front edge detecting means and when receiving the second output signal, for starting its time counting operation and when receiving the first output signal during the time counting operation, for stopping the time counting operation and when performing the time counting operation of a predetermined time, for outputting a reset signal to the activation signal generating means, the front edge detecting means and the first timer means to reset the time counting operation.

With the above arrangement of the second invention, there can be prevented such a phenomenon that, when correction is made over consecutive missing pulses in a video synchronizing pulse signal, phase shifts in horizontal synchronization are accumulated and thus it becomes impossible to detect a front edge in the normal video synchronizing pulse signal any longer.

BRIEF DESCRIPTION OF THE DRAWINGS

FIG. 3 is a timing chart of signals appearing at various parts in a prior art horizontal synchronizing signal separator for explaining the operation thereof.

DESCRIPTION OF THE PREFERRED EMBODIMENTS

An embodiment of the present invention will be explained with reference to the accompanying drawings.

Figure 1:
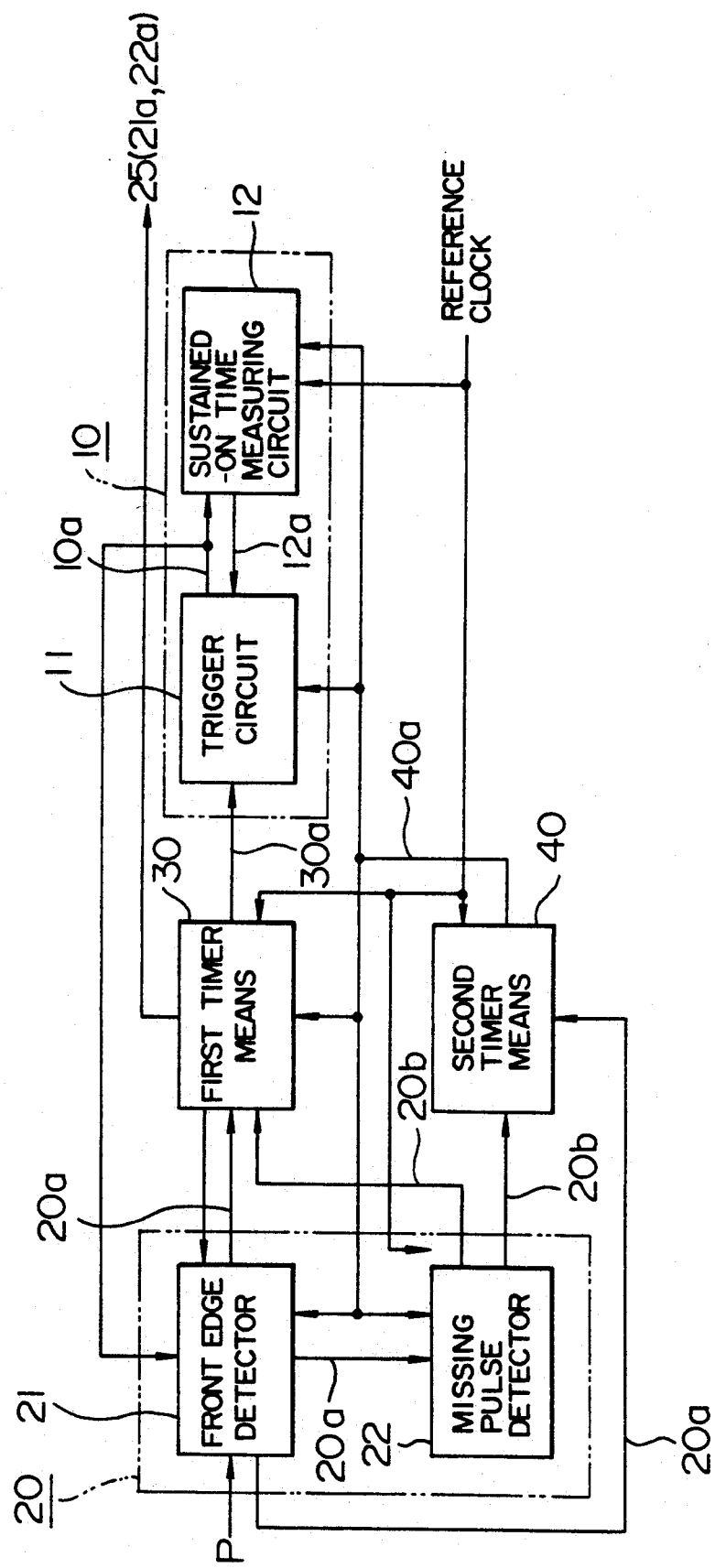
FIG. 1 is a circuit diagram showing a schematic arrangement of a horizontal synchronizing signal separator in accordance with an embodiment of the present invention.

Referring first to FIG. 1, there is shown a circuit diagram showing schematic arrangement of a horizontal synchronizing signal separator in accordance with an embodiment of the present invention. The horizontal synchronizing signal separator of the drawing includes an activation signal generating means 10 which comprises such a trigger circuit 11 as, for example, a flip-flop and a sustained-time measurement circuit 12 for measuring a time of about 0.4 H. The activation signal generating means 10 generates, when triggered, an activation signal 10a for a predetermined sustaining time (about 4/10 of a period H of a horizontal synchronizing signal, i.e., about 0.4 H, here reference symbol H denotes a horizontal synchronization period in the present embodiment).

The trigger circuit 11, when externally triggered to be shifted from its state "0" (indicative of its L (low) level state) to "1" (indicative of its H (high) level state), generates the activation signal 10a. Meanwhile, the sustained-time measurement circuit 12, when receiving the activation signal 10a from the trigger circuit 11, starts measuring a time duration of about 0.4 H and when completing the measurement of the time-out duration, outputs an inversion signal 12a to the trigger circuit 11 to shift the state of the trigger circuit 11 from "1" to "0" and to stop outputting of the activation signal 10a therefrom.

The activation signal generating means 10, when externally triggered in this manner, outputs the activation signal 10a having a sustained time of about 0.4 H.

Figure 2A:
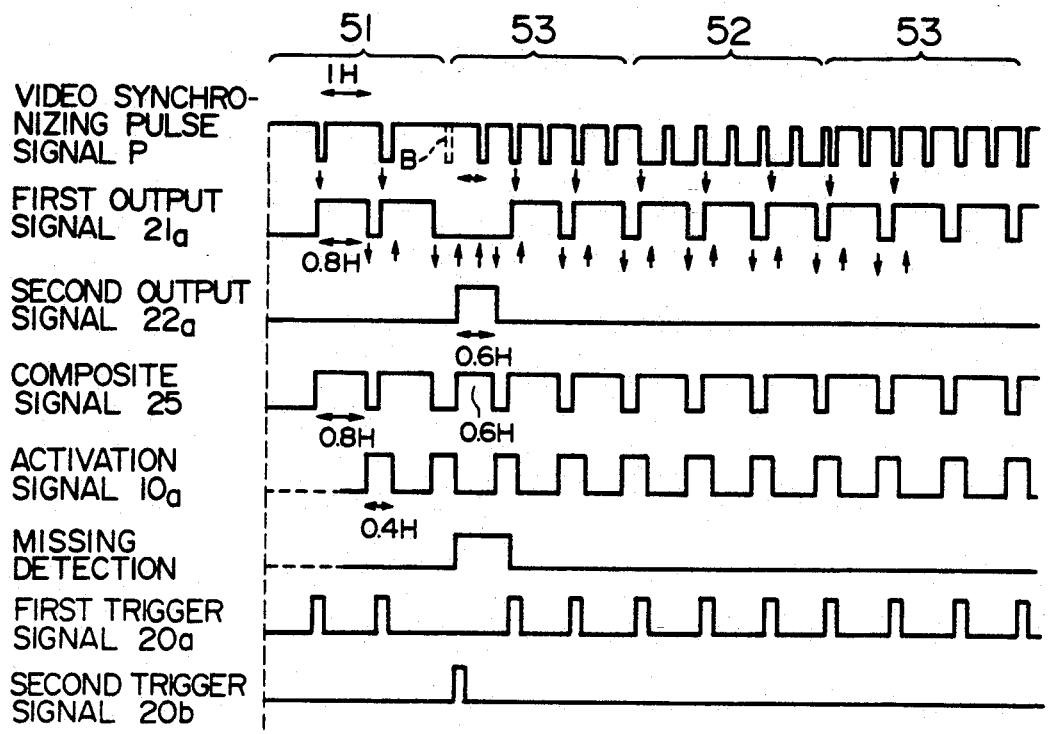
FIGS. 2A and 2B are a timing chart of signals appearing at various parts in the horizontal synchronizing signal separator of FIG. 1 for explaining the operation thereof.

The horizontal synchronizing signal separator also includes a front edge detection means 20 which aforementioned activation signal 10a and such a video synchronization pulse signal P as shown in FIG. 2(A). More specifically, the front edge detection means 20 comprises a front edge detecting circuit 21 for detecting a front edge in the video synchronization pulse signal P when a transition state from "1" to "0" is present in the video synchronization pulse signal P during the "1" period of the activation signal 10a to generate a first start pulse 20a indicative of the detection of a front edge and a front-edge missing detection circuit 22 for generating a second signal start pulse 20b indicative of the detection of a missing front edge when a transition state from "1" to "0" is not present in the video synchronization pulse signal P during the aforementioned period.

In more detail, as explained above, the front edge detector 21, when detecting a transition state from "1" to "0" or a front edge in the video synchronization pulse signal P during the "1" period of the activation signal 10a, outputs the first start pulse 20a.

Meanwhile, the front-edge missing detection circuit 22, when receiving the activation signal 10a, is triggered to start its counting operation of the time 0.4 H. The front-edge missing detection circuit 22, when receiving the first start pulse 20a from the front edge detection circuit 21 during the time counting operation of 0.4 H based on the reception of the activation signal 10a, resets the time counting operation. When failing to receive the first signal start pulse 20a from the front-edge detection circuit 21 during the time counting operation, the front-edge missing detection circuit 22 outputs the second start pulse 20b.

In this way, the front-edge detecting means 20 generates the first start pulse 20a when detecting the front edge of the video synchronization pulse signal P during reception of the activation signal 10a; whereas, the detecting means 20 generates the second start pulse 20b when the reception period of the activation signal 10a expires without any detection of the front edge of the video synchronization pulse signal P.

The horizontal synchronizing signal separator further includes a first timer means 30 which receives the first and second start pulses 20a and 20b from the front-edge detection means 20.

The time-out duration of the first timer means 30 when receiving the first start pulse 20a to be triggered is set to be different from that when receiving the second start pulse 20b to be triggered. In the present embodiment, more specifically, the first timer means 30, when triggered by the first start pulse 20a, generates a first output signal 21a for setting the first time-out duration to be about 0.8 H, whereas, the first timer means 30, when triggered by the second start pulse 20b, generates a second output signal 22a for setting the second time-out duration to be about 0.6 H. And the first timer means outputs a composite signal 25 corresponding to a composition of the aforementioned first and second output signals 21a and 22a. At the end of its time-out duration at which the first and second output signals 21a and 22a change respectively from "1" to "0", the first timer means also outputs a third start pulse 30a to trigger the activation signal generation means 10.

A second timer means 40 receives the first and second start pulses 20a and 20b from the front-edge detection means 20.

More specifically, the second timer 40, when receiving the second start pulse 20a, starts its time counting operation: while the second timer 40, when receiving the first start pulse 20b during the above time counting operation, stops its time counting operation. Further, the second timer means 40, when measuring a predetermined time after the reception of the second signal start pulse 20b, outputs a reset signal 40a to the activation signal generator means 10, the front-edge detector means 20 and the first timer means 30 to thereby reset their time counting functions.

Also externally supplied to the sustained-time measurement circuit 12, front-edge missing detection circuit 22, first timer means 30 and second timer means 40 is a reference clock signal to perform their time counting operation on the basis of the reference clock.

The operation of the horizontal synchronizing signal separator of the present embodiment having such an arrangement as mentioned above will next be explained by timing charts shown in FIGS. 2A and 2B. In the drawings, reference numerals 51, 52 and 53 denote horizontal synchronizing, vertical synchronizing and equalizing pulses in the video synchronizing pulse signal P, respectively.

First, the activation signal generation means 10 is triggered by a third trigger signal 30a received from the first timer means 30 to generate such an activation signal 10a having a sustaining time of about 0.4 H as shown in FIG. 2A that is then sent to the front edge detecting means 20.

The front edge detector 20, when receiving the activation signal 10a from the activation signal generator means 10, detects a front end in such a video synchronizing pulse signal P as shown in FIG. 2A during the reception of the activation signal 10a having a sustaining time of about 0.4 H, and sends such a first start pulse 20a as shown in FIG. 2A to the first timer means 30.

Then, the first timer means 30, when receiving the first start pulse 20a, generates the first output signal 21a to provide the first time-out duration (i.e., about 0.8 H), and sends the third start pulse 30a to the activation signal generation means 10 in synchronism with the time-out of the first output signal 21a.

The above operation is repeated so that the horizontal synchronizing signal is separated from the input video synchronizing pulse signal P.

If there is such a missing pulse (which would be supposed to originally exist) as shown by a broken line in FIG. 2A in the equalizing pulses 53 of the video synchronizing pulse signal P, then the front edge detection means 20 cannot detect the front edge of the pulse B in the video synchronizing pulse signal P during such a sustaining duration of the activation signal 10a as shown by arrows B.

Then, the first timer means 30, when receiving the second start pulse 20b, generates the second output signal 22a to provide the second time-out duration (i.e., about 0.6 H), and sends the third start pulse 30a to the activation signal generation means 10 in synchronism with the time-out of the second output signal 22a. That is, through the above operation, even when failing to detect the front edge of the vide synchronization pulse signal P, the first timer means generates the second output signal 22a at the end of expiration of the sustained time of the activation signal 10a as delayed by about 0.2 H with respect to the first output signal that is output at its normal time.

Accordingly, even when there is a missing pulse in the equalizing pulse signal 53 and so on, the separating operation of the horizontal synchronizing signal from the input video synchronizing pulse signal P is carried out at such timing as shifted only by a phase of about 0.2 H with respect to the normal horizontal synchronization.

Further, a time period between the termination of the sustaining time duration of the activation signal 10a at the time of missing of the equalizing pulse 53 and the output of the third start pulse 30a to the activation signal generation means 10 corresponds to about 0.8 H that is nearly equal to the output period of the normal activation signal 10a, so that the next front edge of the video synchronizing pulse signal P can be detected.

Figure 2B:
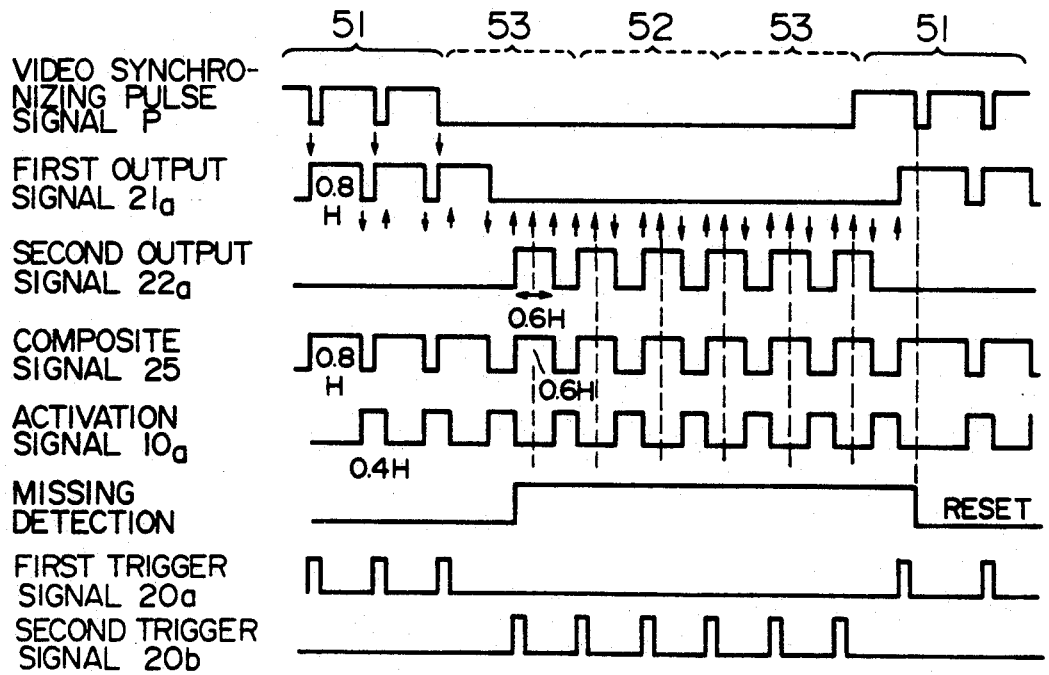

In the case where there are continual missing pulses in the equalizing pulse signal 53 of the video synchronizing pulse signal P as shown in FIG. 2B, the front edge detection means 20 outputs the second output signal 22a as delayed by about 0.2 H after passage of the sustaining duration of the activation signal 10a, after which substantially the same operation as mentioned above is repeated.

The time period between the termination of the sustaining time duration of the activation signal 10a at the time of missing of the equalizing pulse 53 and the output of the third start pulse 30a to the activation signal generation means 10 nearly coincides with the output period of the normal activation signal 10a. However, there occur a certain number of continual missing pulses in the equalizing pulse signal 53, an error between the above mutual periods is accumulated, which results in that it becomes impossible to detect the next normal front edge at a probability of about 60%.

To avoid such a disadvantage, there is provided such a second timer means 40 that receives the first start pulse 20a from the front edge detecting circuit 21 and the second start pulse 20b from the trigger circuit 22, so that the second timer means starts its time counting operation when receiving the second start pulse 20b, while the second timer means stops the time counting operation when receiving the first start pulse 20a during the time counting operation.

When the second timer means completes a predetermined length of time counting operation after the reception of the second start pulse 20b, that is, when a predetermined number of missing pulses continuously takes place in the equalizing pulse signal 53 of the video synchronizing pulse signal P, the second timer means outputs the reset signal 40a to the activation signal generation means 10, front edge detecting means 20 and first timer means 30 to return these components in their initial state to thereby prevent the missing pulses from adversely affecting the next front edge detection.

In addition, the second timer means 40, at the time of outputting the reset signal 40a, resets its time counting operation, which has been so far done, to return its own to its initial state.

As has been explained in the foregoing, in the horizontal synchronizing separator of the present embodiment, the front edge detecting means 20 outputs the first start pulse 20a at the time of detecting a front edge and outputs the second start pulse 20b in the case of a missing pulse or pulses in the equalizing pulse signal 53. The first timer means 30 composes these two start pulses 20a and 20b to generate a composite signal 25.

And the horizontal synchronizing signal is separated from the video synchronizing pulse signal P on the basis of pulse rising edges of the composition signal 25, i.e., pulse rising edges of the first and second output signals 21a and 22a.

As in the foregoing embodiment, in the case where the respective time-out durations of the first and second timer means 30 and 40 are set, even when the vertical synchronization pulse 52 and the equalizing pulse 53 have each a period of ½H, a horizontal synchronization signal can be extracted accurately for each 1H.

As has been disclosed in the foregoing, in accordance with a first invention, there is provided a horizontal synchronizing signal separator which comprises activation signal generating means, when subjected to a triggering operation, for generating an activation signal having a predetermined continuous ON time duration; front edge detecting means for receiving a video synchronizing pulse signal containing a horizontal synchronizing pulse signal as well as the activation signal and for outputting a first start pulse when detecting a front edge of the video synchronizing pulse signal during reception period of the activation signal and for outputting a second start pulse when the reception period of the activation signal is terminated without detecting any front edge of the video synchronizing pulse signal; and first timer means to be triggered when receiving either one of the first and second start pulses from the front edge detecting means, that is, when triggered by the first start pulse, for generating a first output signal when a first time-out duration expires, while, when triggered by the second start pulse, for generating a second output signal when a second time-out duration expires to trigger the activation signal generating means by the first and second output signals and also to cause timing of the activation signal to substantially coincide with timing of the front edge of the video synchronizing pulse signal.

With the aforementioned arrangement of the first invention, since a pulse missing in the video synchronizing pulse signal is corrected to minimize a phase shift in the horizontal synchronization, the horizontal synchronizing signal can be separated stably.

In accordance with a second invention, there is provided second timer means for receiving said first and second start pulses and when receiving said second start pulse, for starting its time counting operation and when receiving said first start pulse during the time counting operation, for stopping the time counting operation and when starting the time counting operation and when a predetermined time elapses, for outputting a reset signal to said activation signal generating means, said front edge detecting means and said first timer means to reset the time counting operation.

With the above arrangement of the second invention, there can be prevented such a phenomenon that, when correction is made over consecutive missing pulses in a video synchronizing pulse signal, phase shifts in horizontal synchronization are accumulated and thus it becomes impossible to detect a front edge in the normal video synchronizing pulse signal any longer.

What is claimed is:

1. A horizontal synchronizing signal separator comprising:
    activation signal generating means, when subjected to a triggering operation, for generating an activation signal having a predetermined continuous ON time duration;
    front edge detecting means for receiving a video synchronizing pulse signal containing a horizontal synchronizing pulse signal as well as the activation signal and for outputting a first start pulse when detecting a front edge of the video synchronizing pulse signal during reception period of the activation signal and for outputting a second start pulse when the reception period of the activation signal is terminated without detecting any front edge of the video synchronizing pulse signal; and
    first timer means to be triggered when receiving either one of the first and second start pulses from the front edge detecting means, that is, when triggered by the first start pulse, for generating a first output signal when a first time-out duration expires, while, when triggered by the second start pulse, for generating a second output signal when a second time-out duration expires to trigger the activation signal generating means by the first and second output signals and also to cause timing of the activation signal to substantially coincide with timing of the front edge of the video synchronizing pulse signal.

2. A horizontal synchronizing signal separator as set forth in claim 1, wherein said activation signal generating means includes a sustained ON-time measuring circuit for starting counting a time-out duration of 0.4 H in synchronism with a rising pulse and a trigger circuit for being reset when said time-out duration of said sustained On-time measuring circuit expires.

3. A horizontal synchronizing signal separator as set forth in claim 1, wherein said first time-out duration is set to be 0.8 H and said second time-out duration is set to be 0.6 H.

4. H horizontal synchronizing signal separator comprising:
    activation signal generating means, when subjected to a triggering operation, for generating an activation signal having a predetermined continuous ON time duration;
    front edge detecting means for receiving a video synchronizing pulse signal containing a horizontal synchronizing pulse signal as well as the activation signal and for outputting a first start pulse when detecting a front edge of the video synchronizing pulse signal during reception period of the activation signal and for outputting a second start pulse when the reception period of the activation signal is terminate without detecting any front edge of the video synchronizing pulse signal;
    first timer means to be triggered when receiving either one of the first and second start pulses from the front edge detecting means, that is, when triggered by the first start pulse, for generating a first output signal when a first time-out duration expires, while, when triggered by the second start pulse, for generating a second output signal when a second time-out duration expires to trigger the activation signal generating means by the first and second output signals and also to cause timing of the activation signal to substantially coincide with timing of the front edge of the video synchronizing pulse signal; and
    second timer means for receiving said first and second start pulses and when receiving said second start pulse, for starting its time counting operation and when receiving said first start pulse during the time counting operation, for stopping the time counting operation and when starting the time counting operation and when a predetermined time elapses, for outputting a reset signal to said activation signal generating means, said front edge detecting means and said first timer means to reset the time counting operation.

5. A horizontal synchronizing signal separator as set forth in claim 4, wherein said activation signal generating means includes a sustained ON-time measuring circuit for starting measuring a time-out duration of 0.4 H in synchronism with a rising pulse and a trigger circuit for being reset when said time-out duration of said sustained ON-time measuring circuit expires.

6. A horizontal synchronizing signal separator as set forth in claim 4, wherein said first time-out duration is set to be 0.8 H and said second time-out duration is set to be 0.6 H.

* * * * *